United States Patent
Shimizu

[11] Patent Number: 5,539,701
[45] Date of Patent: Jul. 23, 1996

[54] SENSE CIRCUIT FOR SEMICONDUCTOR MEMORY DEVICES

[75] Inventor: Shin Shimizu, Tokyo, Japan

[73] Assignee: Nippon Steel Corporation, Tokyo, Japan

[21] Appl. No.: 511,445

[22] Filed: Aug. 4, 1995

[30] Foreign Application Priority Data

Aug. 5, 1994 [JP] Japan ................................. 6-204451

[51] Int. Cl.⁶ ............................................ G11C 7/00
[52] U.S. Cl. ...................... 365/207; 365/202; 365/208
[58] Field of Search .................................. 365/205, 202, 365/203, 208, 207, 190

[56] References Cited

U.S. PATENT DOCUMENTS

| | | | |
|---|---|---|---|
| 5,323,345 | 6/1994 | Ohsawa | 365/207 X |
| 5,323,349 | 6/1994 | Hamada et al. | 365/207 |
| 5,386,394 | 1/1995 | Kawahara et al. | 365/207 x |
| 5,444,662 | 8/1995 | Tanaka et al. | 365/207 X |

*Primary Examiner*—Do Hyun Yoo
*Attorney, Agent, or Firm*—Pollock, Vande Sande & Priddy

[57] ABSTRACT

A sense circuit for a DRAM has a sense amplifier provided for each pair of bit lines, a pair of re-storing lines for providing a re-storing voltage therebetween, and a re-storing switch connected between one pair of bit lines and the pair of re-storing lines. A pair of switching elements are provided for each pair of bit lines and are connected between its associated one pair of bit lines and sense amplifier so that the sense amplifier is electrically connected with and electrically disconnected from the one pair of bit lines when the pair of switching elements are conductive and non-conductive, respectively. The re-storing switch is responsive to a turn-off of the pair of switching elements to electrically connect its associated pair of bit lines with the pair of re-storing lines for supplying the re-storing voltage to the pair of bit lines.

5 Claims, 5 Drawing Sheets

SENSE CIRCUIT FOR SEMICONDUCTOR MEMORY DEVICES

BACKGROUND OF THE INVENTION

FIELD OF THE INVENTION

The present invention relates to a sense circuit for semiconductor memory devices, and more particularly to a sense circuit which is suitable for faster operations of MOS type dynamic random access memory (DRAM) integrated circuits.

Conventionally, in a DRAM, a cell for storing information is provided at each intersection between one pair of bit lines and a word line, and composed of an access transistor and a capacitor, wherein stored information is held as an amount of charges accumulated in the capacitor. With this configuration, to output the stored information held in the capacitor to the outside, the amount of charges must be amplified through a sense amplifier to generate a signal having a predetermined magnitude.

FIG. 1 shows a part of a peripheral circuit including a sense amplifier for a DRAM. A similar configuration is also shown, for example, in "1989 IEEE ISSCC", pp. 246–247. In FIG. 1, an NMOS (n-type MOS) access transistor 38 and a capacitor 39 constitute a memory cell. One terminal of the access transistor 38 is connected to a bit line (BL) 36.

A signal on the bit line 36 is transmitted to one input/output terminal (RL) 46 of a sense amplifier 48 through a switching element 43 formed of an NMOS transistor. On the other hand, an opposite bit line ($\overline{BL}$) 37, which is not connected with the memory cell having the access transistor 38 turned on and connected to a word line (WL) 41 under consideration, supplies a reference voltage (normally Vcc/2) to the other input/output terminal ($\overline{RL}$) 47 of the sense amplifier 48 through a switching element 44. This reference voltage is supplied from a reference voltage line (VBLP) 31 through a transistor 35.

Charges accumulated in the capacitor 39 through the above-mentioned configuration are amplified by the sense amplifier 48. An output signal of the sense amplifier 48 is transmitted to external output lines (DL, $\overline{DL}$) 53, 54 through NMOS transistors 51, 52 which are turned on by a selection signal (COL) 50 generated by a column address signal for the memory.

Transistors 33, 34, 35 in the circuit are turned on by an equalization signal (PEQ) 32 to couple a reference signal line (VBLP) 31 to the pair of bit lines (BL, $\overline{BL}$) 36, 37 for equalizing the potentials on the respective bit lines.

FIG. 2 shows an example of a circuit configuration typically used in the sense amplifier circuit 48. In this circuit, sense amplifier activation signals ($\overline{SP}$, SN) 45, 49 turn on transistors 60, 65 held at a power supply potential and, a ground potential, respectively, to cause the sense amplifier to initiate its operation, so that amplified signals are delivered to input/output lines (input/output terminals) 46, 47, respectively. Each of the amplified signals has a polarity in accordance with a difference between potentials appearing on the input/output lines (input/output terminals) (RL, $\overline{RL}$) 46, 47 on which signals are transmitted from the bit lines 36, 37. The input/output lines (input/output terminals) 46, 47 of the sense amplifier are also referred to as "read-out line(s)" in the following description.

A scheme using the above-mentioned sense amplifier is referred to as a latch type sensing scheme which has been widely employed in DRAMs. A latch circuit composed of PMOS (p-type MOS) transistors 61, 62 and NMOS transistors 63, 64 is essentially a flip-flop circuit similar to an SRAM cell. Since the operation of such a latch circuit is well known in the art, explanation thereof is omitted. Reference numerals 59, 66 designate terminals which provide a supply voltage Vcc and a ground voltage, respectively.

A read-out operation based on the configuration described above may be conceptually represented by waveform charts of FIG. 3. It is assumed that one terminal of the capacitor 39 is connected to a terminal (VCP) 40, and the capacitor 39 accumulates charges at the level of the power supply potential Vcc (5 volts). Assume also that the ground potential is, for example, zero volts, and the reference voltage is 2.5 volts. In an initial state, since an equalization signal (PEQ) 32 is at five volts, the NMOS transistors 33, 34, 35 are turned on to cause the reference signal at 2.5 volts to be supplied from the reference signal line 31 to the bit lines 36, 37.

When the equalization signal 32 falls from five volts to zero volts in synchronism with a RAS signal (not shown), and then the word line 41 is selected so that the voltage thereon rises from zero volts to approximately 7.5 volts, the access transistor 38 is turned on to cause charges accumulated in the capacitor 39 to appear on the bit line 36. This results in the potential on the bit line 36 rising a little more than 2.5 volts. On the other hand, the potential on the bit line 37, presenting few changes, is held at 2.5 volts.

When a small difference between the potentials on these bit lines 36, 37 increases to approximately 300 millivolts with the voltage on the word line 41 being in a raised state, a bit line switching signal (SE) 42 changes from zero volts to five volts to cause the switching transistors 43, 44 to turn on.

After the signals on the bit lines 36, 37 have been transmitted to the input/output lines of the sense amplifier 48 through the transistors 43, 44, the sense amplifier activation signals 45, 49 changed to zero volts and five volts, respectively, allowing the sense amplifier to operate, with the result that the difference between the potentials on the bit lines 36, 37 as well as the difference between the potentials on the read-out lines (input/output lines of the sense amplifier 48) 46, 47 begin to increase.

At the time the difference between the potentials on the read-out lines 46, 47 further increases, a selection signal 50 supplies a pulse having an amplitude of five volts. This causes the NMOS transistors 51, 52 to turn on only for a duration of the pulse width so that the small potential difference appears between the external output lines 53, 54 for that period. This signal is typically received and amplified by a current mirror type sense amplifier having a higher sensitivity, and outputted to the outside.

When the pulse is supplied onto the selection signal line 50, the external output lines 53, 54 act as large loads, viewed from the sense amplifier 48, so that the potential differences between signals on the read-out lines 46, 47 and between signals on the bit lines 36, 37 are reduced. When the pulse is ended, however, the potential differences again increase.

Subsequently, an amount of charges corresponding to stored information must be re-stored into the memory cell. For this purpose, the sense amplifier 48 is driven to provide five volts to the read-out line 46 and the bit line 36 as well as zero volts to the read-out line 47 and the bit line 37. The potential on the word line 41 is decreased from 7.5 volts to zero volts when the re-storage is completed.

Then, after peripheral control signals of the sense amplifier 48 are made inactive the voltage of the equalization signal 32 is raised, and the bit lines 36, 37 are equalized to complete the read-out operation.

However, when the prior art example as described above is used in a DRAM, problems may arise as follows. Specifically, a bit line capacitance parasitic on the bit line is typically large and approximately ten times more than the capacitance of a capacitor included in a memory cell. Also, due to the configuration of the sense amplifier, a gate capacitance and a bonding capacitance of the sense amplifier itself also act as non-negligible loads.

Therefore, when an amount of charges accumulated in a capacitor is amplified by the sense amplifier 48 or when re-storage is performed, a self load of the sense amplifier, and parasitic capacitances on a bit line and a read-out line, on which read charges are transmitted, are regarded as a load, viewed from the sense amplifier. Particularly, this increase in load tends to extend a delay time required to re-store information into memory cells.

SUMMARY OF THE INVENTION

It is an object of the present invention to provide a sense circuit which is capable of re-storing information into memory cells of a DRAM at higher speed.

According to one aspect of the present invention, a sense circuit for a DRAM has a sense amplifier provided for each pair of bit lines, a pair of re-storing lines for providing a re-storing voltage therebetween, and a re-storing switch connected between one pair of bit lines and the pair of re-storing lines. A pair of switching elements is provided for each pair of bit lines and is connected between its associated one pair of bit lines and a sense amplifier so that the sense amplifier is electrically connected with and electrically disconnected from the one pair of bit lines when the pair of switching elements is conductive and non-conductive, respectively. The re-storing switch is responsive to a turn-off of the pair of switching elements to electrically connect its associated pair of bit lines with the pair of re-storing lines for supplying the re-storing voltage to the pair of bit lines.

In the one aspect of the present invention, when a re-storing operation is performed for a memory cell after transmission of a read-out signal to the outside is completed, a pair of switching elements on the differential signal lines (bit line pair) are turned off to disconnect the differential signal lines (bit line pair) from the sense amplifier.

In this event, since parasitic capacitances on the differential signal lines (bit line pair) are not visible from the sense amplifier so that the sense amplifier is only required to drive its own load, parasitic capacitances on peripheral wiring conductors and an input capacitance of the re-storing switch, the sense amplifier operates at a higher speed, and potentials on a pair of read-out lines connected to input/output terminals of the sense amplifier reach a power supply potential and a ground potential, respectively. A potential difference between the pair of read-out lines (a pair of input/output terminals of the sense amplifier) is again applied to the re-storing switch to close the same. As a result, the pair of bit lines is electrically connected to the pair of re-storing lines to receive re-storing voltages from the re-storing lines.

Thus, the differential signal lines (bit line pair) are supplied with potentials corresponding to original information in an associated memory cell, such that the capacitor is charged using the potentials.

DESCRIPTION OF THE PREFERRED EMBODIMENT

One embodiment of a sense circuit for a semiconductor memory device according to the present invention will hereinafter be described with reference to the accompanying drawings.

Figure 4:
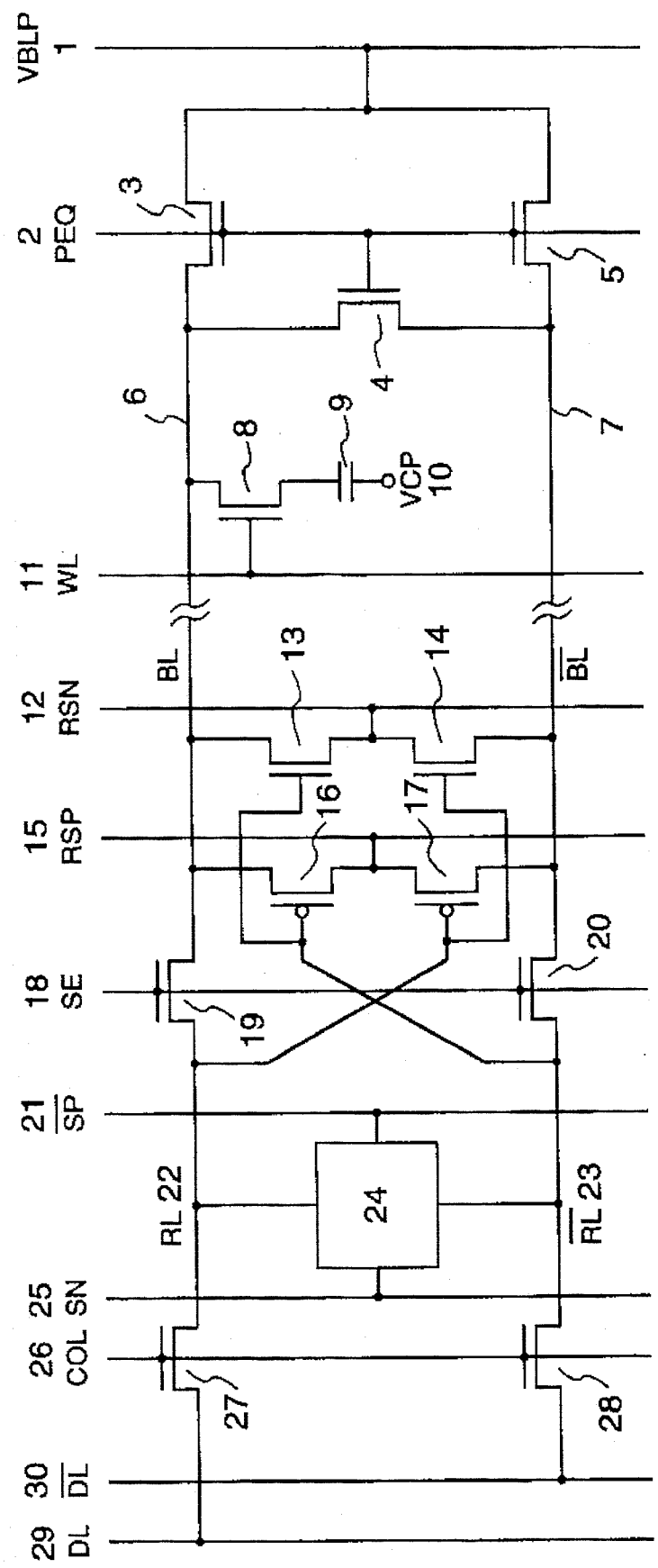
FIG. 4 is a circuit diagram showing a main portion of a DRAM including a sense amplifier according to one embodiment of the present invention.

FIG. 4 is a circuit diagram showing a DRAM including a sense circuit according to one embodiment of the present invention. In this embodiment, a memory cell is composed of an NMOS access transistor 8 and a capacitor 9. One terminal of the access transistor 8 is connected to a bit line 6. A sense amplifier 24 is provided for each pair of bit lines.

A signal on the bit line (BL) 6 is supplied to one input/output terminal (RL) 22 of the sense amplifier 24 through a switching element 19 formed of an NMOS transistor. This input/output terminal 22 is connected to one a pair of read-out lines. An opposite bit line ($\overline{BL}$) 7, which is not connected with the cell having the access transistor 8 turned on by a word line (WL) 11 under consideration, supplies the remaining input/output terminal ($\overline{RL}$) 23 of the sense amplifier 24 with a reference signal potential (normally one half of a power supply voltage Vcc) through a switching element 20. This input/output terminal 23 is connected to the other line in the pair of read-out lines. The reference voltage is supplied from a reference voltage line (VBLP) 1 through a transistor 5.

By the configuration described above, an amount of charges accumulated in the capacitor 9 is amplified by the sense amplifier circuit. A signal based on this charge amount is transmitted to external output lines (DL, $\overline{DL}$) 29, 30 through NMOS transistors 27, 28 which are turned on by a selection signal (COL) 26 generated from a column address signal for the memory. NMOS transistors 3, 4, 5 in the circuit are turned on by an equalization signal (PEQ) 2 to transmit a potential on the reference signal line (VBLP) 1 to the pair of bit lines 6, 7 for equalizing potentials thereon.

Further, transistors constituting a re-storing switch are connected in series between the pair of bit lines 6, 7. While two sets of series connected elements including two PMOS transistors 16, 17 and two NMOS transistors 13, 14 are employed in this embodiment, either one of these series connected elements also serves for this purpose. A pair of re-storing lines (RSP, RSN) 15, 12 is provided for supplying a re-storing voltage therebetween. The re-storing switch is provided for each bit line pair and connected between an associated bit line pair and the pair of re-storing lines 15, 12.

The drains of the PMOS transistor 16 and the NMOS transistor 13 are connected to one line 6 in the pair of bit lines, while the drains of the PMOS transistor 17 and the NMOS transistor 14 are connected to the other line 7 in the pair of bit lines, opposite to the bit line 6.

The sources of the PMOS transistors 16, 17 are connected to one of the pair of re-storing lines 15, while the sources of the NMOS transistors 13, 14 are connected to the other of the pair of re-storing lines 12. Also, the gates of the PMOS transistor 16 and the NMOS transistor 13 are connected to the read-out line (one of the pair of input/output terminals of the sense amplifier 24) 23, while the gates of the PMOS transistor 17 and the NMOS transistor 14 are connected to the read-out line (the other of the pair of input/output terminals of the sense amplifier 24) 22.

Figure 1:
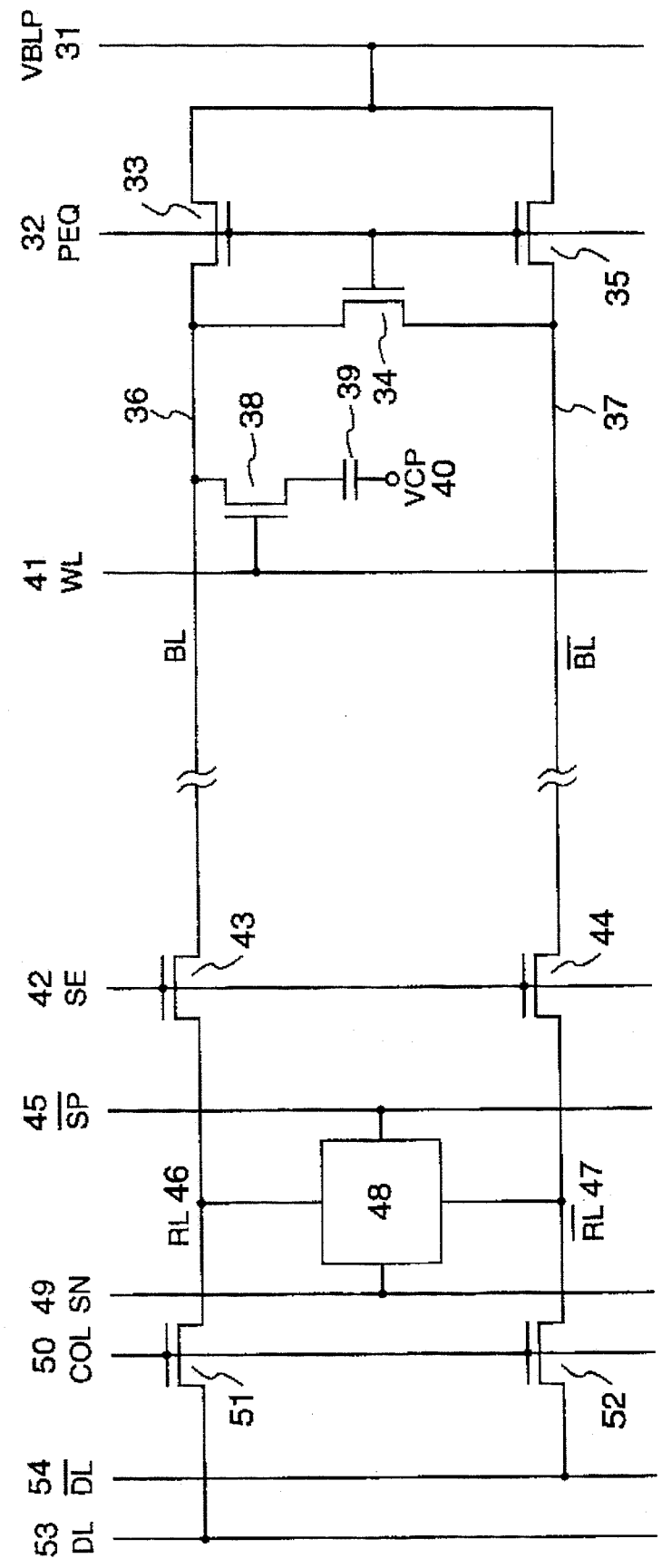
FIG. 1 is a circuit diagram for explaining an example of a prior art sense circuit.
Figure 2:
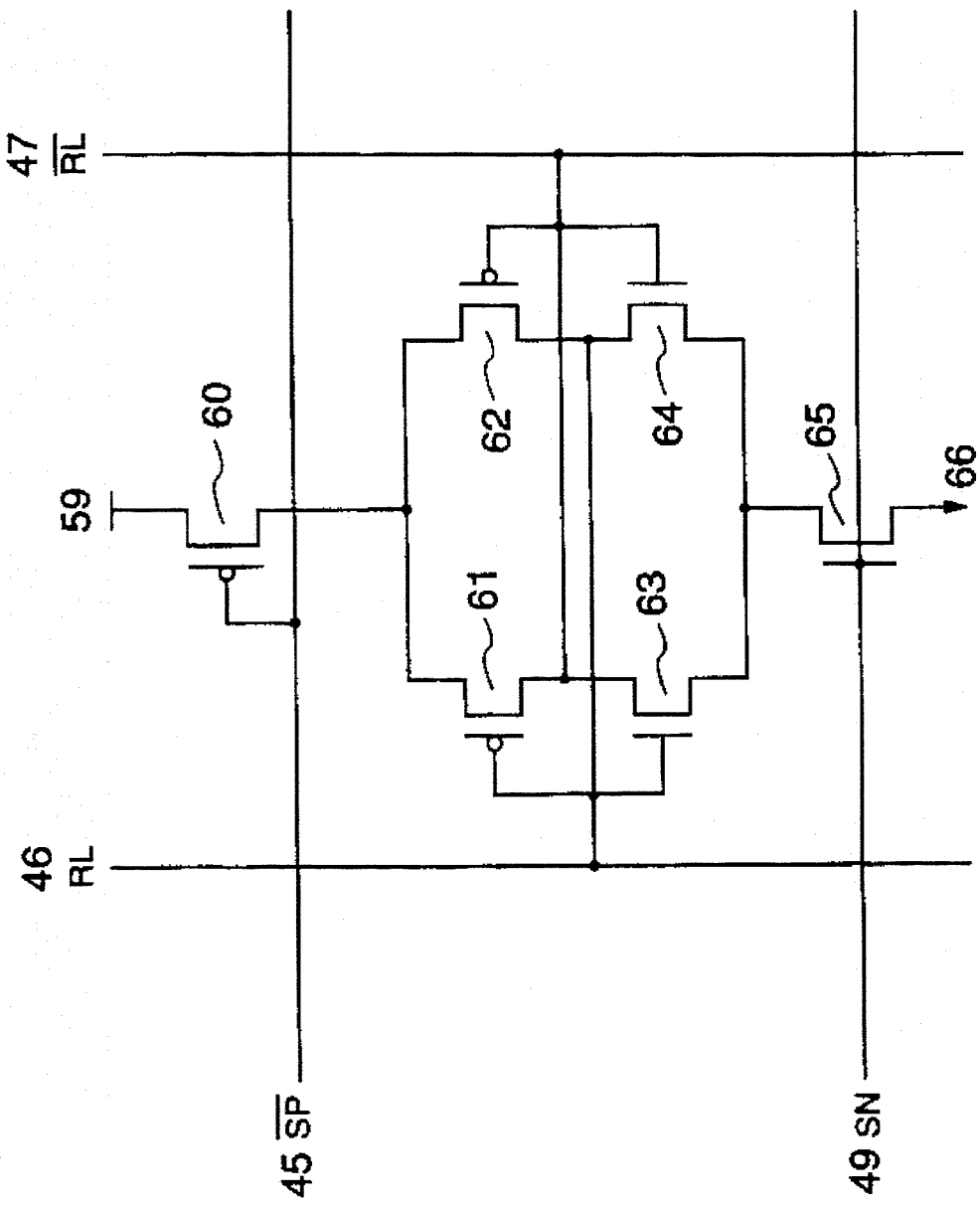
FIG. 2 is a schematic circuit diagram showing an example of a prior art sense amplifier circuit.
Figure 3:
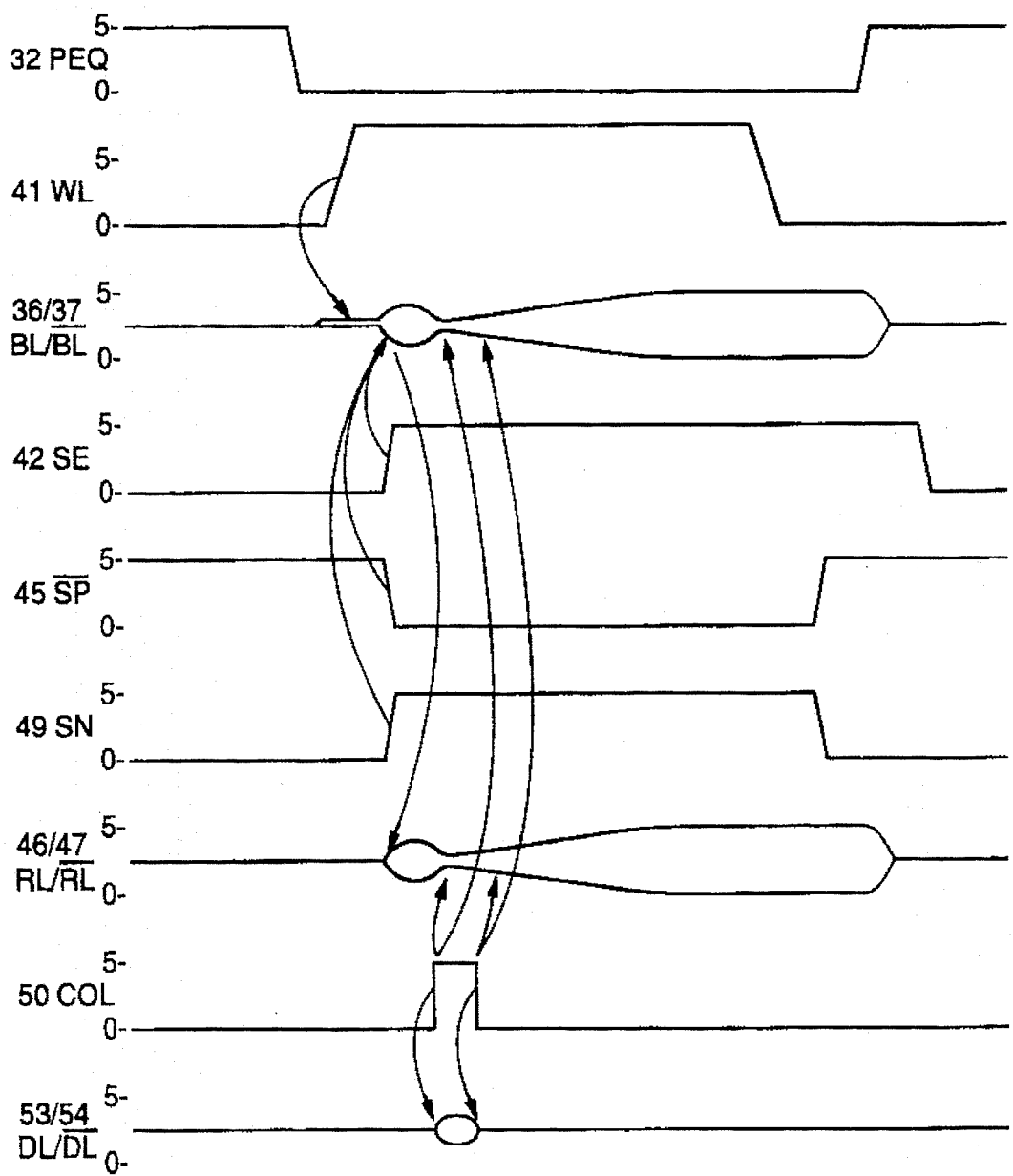
FIG. 3 shows operational waveform charts at various locations in the circuit diagram of FIG. 1.

The sense amplifier 24 may be implemented by a generally employed circuit configuration as shown in FIG. 2.

Figure 5:
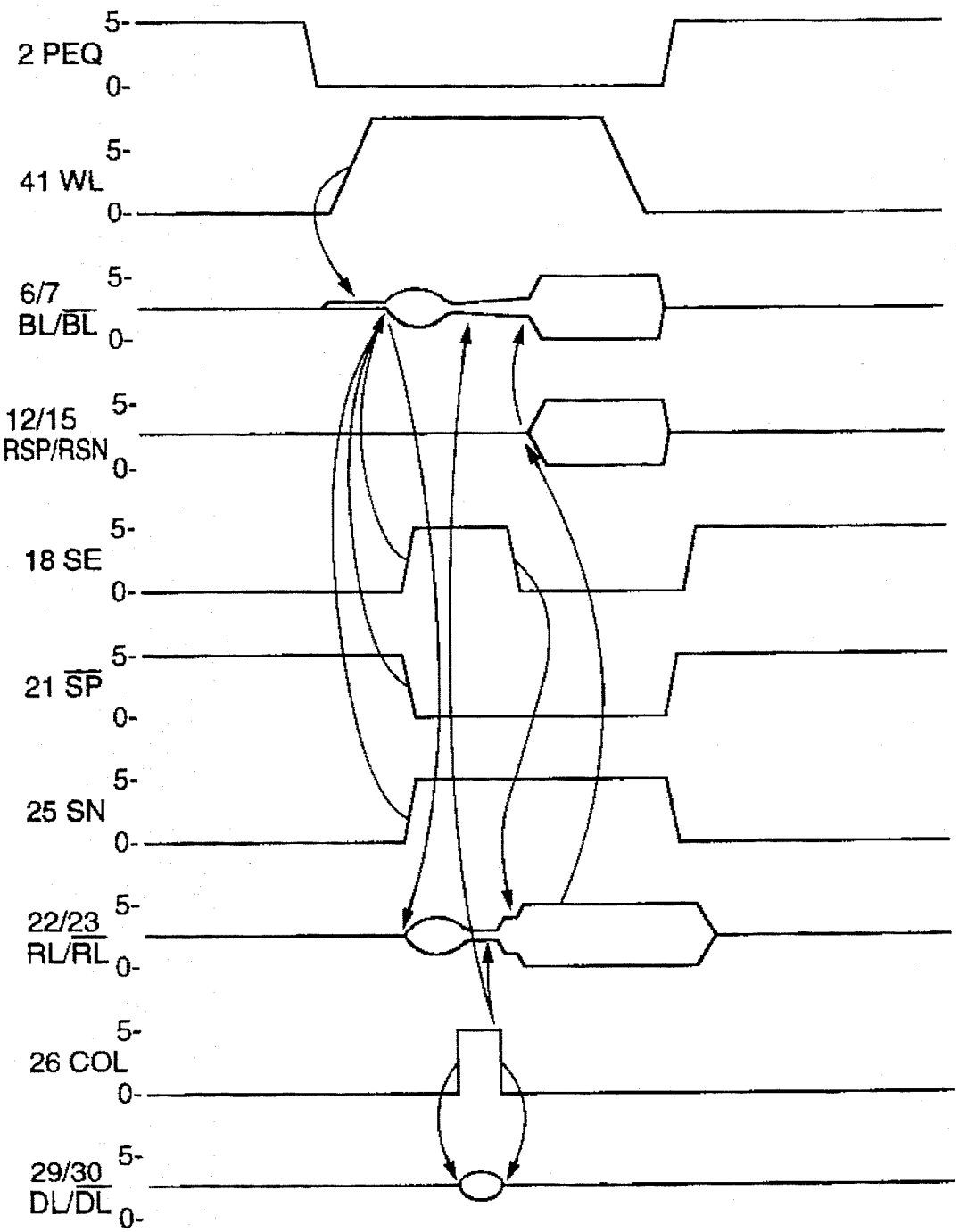
FIG. 5 shows operational waveform charts at various locations in the circuit diagram of FIG. 4.

An outline of a read-out operation based on the configuration described above is represented by waveform charts of FIG. 5. Here, one end of the capacitor 9 is connected to a terminal (VCP) 10, and the capacitor accumulates charges at the level of the power supply potential Vcc (five volts). The ground potential is zero volts, and the reference signal line (VBLP) 1 is, for example, 2.5 volts.

In an initial state, the NMOS transistors 3, 4, 5 are turned on due to the equalization signal (PEQ) 2 being at five volts, so that the pair of bit lines 6, 7 are supplied with the reference voltage 2.5 volts from the reference signal line (VBLP) 1. When the equalization signal 2 falls from five volts to zero volts, and then the word line (WL) 11 rises from zero volts to approximately 7.5 volts, the access transistor 8 is turned on to cause charges accumulated in the capacitor 9 to appear on the bit line 6. This results in an increase of the potential on the bit line 6 to slightly higher than 2.5 volts.

On the other hand, the bit line 7, presenting few changes, is held at 2.5 volts. When a small potential difference between the bit lines 6, 7 increases to approximately 300 millivolts and the voltage on the word line 11 is in a raised state, a bit line switching signal 18 changes from zero volts to five volts to cause the switching transistors 19, 20 to turn on.

After signals on the bit lines 6, 7 have been transmitted to the read-out lines 22, 23, sense amplifier activation signals (SN, $\overline{SP}$) 25, 21 change to five volts and zero volts, respectively, to cause the sense amplifier to operate, whereby potential differences begin to increase between the bit lines 6, 7 and between the read-out lines 22, 23.

When the potential difference further increases between the read-out lines 22, 23, the selection signal (COL) 26 supplies a pulse having an amplitude of five volts. This causes the NMOS transistors 27, 28 to turn on only for a duration of the pulse width so that the small potential difference (read-out signal amplified by the sense amplifier) appears on the external output lines ($\overline{DL}$) 29, 30 for that period.

This signal is typically received and amplified by a current mirror type sense amplifier having a higher sensitivity, and outputted to the outside. The re-storing signals (RSP, RSN) 15, 12 are held at the reference potential from the above-mentioned initial state until the read-out signals appear on the output lines 29, 30.

Since the external output lines 29, 30 act as large loads, viewed from the sense amplifier 24, the potential differences between the read-out lines 22, 23 and between the bit lines 6, 7 decrease, when the pulse is supplied to the selection signal line 26, as is the case in the prior art example. However, when the pulse disappears, the potential differences again increase. Thereafter, an amount of charges corresponding to stored information must be re-stored into an associated memory cell.

At this time, the switching control signal (SE) 18 is lowered from five volts to zero volts to turn off the NMOS transistors (a pair of switching elements) 19, 20 to electrically disconnect the pair of bit lines 6, 7 from the pair of read-out lines 22, 23. A load on the sense amplifier 24 at this time consists only of parasitic capacitances on the read-out lines 22, 23. Therefore, a potential difference between the read-out lines 22, 23 rapidly increase to the extent that the former line reaches the power supply potential and the latter line reaches the ground potential. Thereafter, the re-storing signals 15, 12 are again brought to the power supply voltage and the ground voltage, respectively, for a re-storing operation.

The power supply potential is generated on the read-out line 22 and the ground potential on the read-out line 23 to make non-conductive the re-storing transistor 17 which is supplied with the power supply potential at its gate, as well as to make the re-storing transistor 14 conductive. The re-storing transistor 16 which is supplied with the ground potential at its gate, in turn, is conductive, while the re-storing transistor 13 is non-conductive. It will be understood from the foregoing that the pair of bit lines 6, 7 are supplied with the power supply voltage and the ground voltage, respectively, while a connection point (memory node) between the access transistor 8 and the capacitor 9 is supplied with the power supply voltage to carry out the information re-storing to an associated memory cell. It should be noted that in this event, the gate capacitances of the re-storing transistors 16, 17, 13, 14 do not constitute a load during the re-storing.

At the time the re-storing is completed, the potential on the word line I1 is lowered from 7.5 volts to zero volts. Responsive to this, the re-storing signals 15, 12 change to Vcc/2 from Vcc and the ground potential, respectively. Then, the equalization signal, i.e., precharge control signal (PEQ) 2 rises from zero volts to five volts to precharge the bit lines 6, 7 to Vcc/2. Next, the sense amplifier activation signals (Sn, $\overline{SP}$) 25, 21 transit to five volts and zero volts, respectively, to make the sense amplifier inactive. Subsequently, the switching signal SE rises to five volts to precharge the read-out lines 22, 23 to Vcc/2. The read-out is completed by the foregoing operations.

According to the embodiment described above, a time required for the re-storing of information into memory cells can be largely reduced as compared with conventional sense amplifiers, which further leads to a reduction in cycle time of the memory. It is thus possible to realize a memory circuit which provides faster operations.

I claim:

1. A sense circuit for a DRAM having a plurality of parallel bit lines forming complementary pairs with each other, a plurality of parallel word lines perpendicularly located with respect to said plurality of bit lines, and a plurality of memory cells, wherein each memory cell is located within one pair of bit lines and at an intersection of said one pair with one word line, said circuit comprising:

at least one sense amplifier having a pair of input/output terminals connected to said one pair of bit lines for sensing potential difference therebetween;

at least one pair of switching elements located between said one pair of bit lines and said pair of input/output terminals of said one sense amplifier, whereby said sense amplifier is electrically connected to and electrically disconnected from said one pair of bit lines when said pair of switching elements is conductive and non-conductive, respectively;

at least one pair of restoring lines for supplying a restoring voltage potential to said one pair of bit lines; and at least one restoring switch connected between said one pair of bit lines and said pair of restoring lines, wherein said restoring switch electrically connects said one pair of bit lines to said one pair of restoring lines when said pair of switching elements is turned off, thereby supplying said restoring voltage potential to said one pair of bit lines.

2. The sense circuit according to claim 1, further comprising at least two restoring switches connected between said one pair of bit lines and said pair of restoring lines, wherein said one pair of restoring lines is common to said two restoring switches.

3. The sense circuit according to claim 1, wherein said one restoring switch includes a pair of series-connected NMOS transistors and a pair of series-connected PMOS transistors, wherein said pairs of NMOS and PMOS transistors are connected to said pair of bit lines, and wherein:

one NMOS and one PMOS transistor of said NMOS and PMOS pair, respectively, have drains connected to one line of said pair of bit lines, and the remaining NMOS and PMOS transistor of said NMOS and PMOS pair, respectively, have drains connected to the remaining line of said pair of bit lines:

said NMOS pair has sources connected in common to one line of said pair of restoring lines, and said PMOS pair has sources connected in common to the remaining line of said pair of restoring lines; and said one NMOS and one PMOS transistor of said NMOS and PMOS pair, respectively, have gates connected to one input/output terminal of said pair of input/output terminals of said one sense amplifier, and the remaining NMOS and PMOS transistor of said NMOS and PMOS pair, respectively, have gates connected to the remaining input/output terminal of said pair of input/output terminals.

4. A DRAM having a plurality of parallel bit lines forming complementary pairs with each other, a plurality of parallel word lines perpendicularly located with respect to said plurality of bit lines, and a plurality of memory cells, wherein each memory cell is located within one pair of bit lines and at an intersection of said one pair with one word line, said DRAM comprising:

at least one sense amplifier having a pair of input/output terminals connected to said one pair of bit lines for sensing potential difference therebetween;

at least one pair of switching elements located between said one pair of bit lines and said pair of input/output terminals of said one sense amplifier, whereby said sense amplifier is electrically connected to and electrically disconnected from said one pair of bit lines when said pair of switching elements is conductive and non-conductive, respectively;

at least one pair of restoring lines for supplying a restoring voltage potential to said one pair of bit lines; and at least one restoring switch connected between said one pair of bit lines and said pair of restoring lines, wherein said restoring switch electrically connects said one pair of bit lines to said one pair of restoring lines when said pair of switching elements is turned off, thereby supplying said restoring voltage potential to said one pair of bit lines.

5. The DRAM according to claim 4, further comprising an equalizing circuit which includes:

a reference signal line for providing a reference voltage potential;

first, second and third MOS transistors connected to said one pair of bit lines, wherein said first MOS transistor has a source-to-drain path connected between said reference signal line and one line of said pair of bit lines, and said second MOS transistor has a source-to-drain path connected between said reference signal line and the remaining line of said pair of bit lines, and said third transistor has a source-to-drain path connected between said lines of said pair of bit lines, and an equalization signal line connected to gates of said first, second and third transistors for providing a signal to make said first, second and third transistors conductive, whereby said reference voltage potential is supplied to said pair of bit lines via said first, second and third transistors.

* * * * *